(12) United States Patent
Fujita et al.

(10) Patent No.: US 12,360,059 B2
(45) Date of Patent: Jul. 15, 2025

(54) FOREIGN MATTER INSPECTION APPARATUS, FOREIGN MATTER INSPECTION METHOD, PROCESSING APPARATUS, AND ARTICLE MANUFACTURING METHOD

(71) Applicant: CANON KABUSHIKI KAISHA, Tokyo (JP)

(72) Inventors: Yuichi Fujita, Tochigi (JP); Shinichiro Hirai, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 216 days.

(21) Appl. No.: 17/827,050

(22) Filed: May 27, 2022

(65) Prior Publication Data

US 2022/0291144 A1  Sep. 15, 2022

Related U.S. Application Data

(63) Continuation of application No. PCT/JP2020/043560, filed on Nov. 24, 2020.

(30) Foreign Application Priority Data

Dec. 5, 2019  (JP) ................. 2019-220760

(51) Int. Cl.
*G01N 21/956* (2006.01)
*G01N 21/47* (2006.01)
*H01L 21/027* (2006.01)

(52) U.S. Cl.
CPC .......... *G01N 21/956* (2013.01); *G01N 21/47* (2013.01); *G01N 21/95607* (2013.01); *H01L 21/0271* (2013.01)

(58) Field of Classification Search
CPC ................. G01N 21/956; G01N 21/47; G01N 21/95607; G01N 21/9501; G01N 21/59;
(Continued)

(56) References Cited

U.S. PATENT DOCUMENTS 6,122,047 A * 9/2000 Stover .................... G01N 21/94
356/338
6,208,750 B1   3/2001 Tsadka
(Continued)

FOREIGN PATENT DOCUMENTS

JP   S62261044 A   11/1987
JP   S63285449 A   11/1988
(Continued)

*Primary Examiner* — Jonathan M Hansen
(74) *Attorney, Agent, or Firm* — Canon U.S.A., Inc. IP Division

(57) ABSTRACT

A inspection apparatus for detecting a foreign matter on a substrate on which a pattern is formed includes a detection unit including a light projector for projecting light on a surface of the substrate and a light receiver, a change mechanism for changing an area of the light projected by the light projector to a first area and a second area that is smaller than the first area without changing a light amount, and a control unit for detecting the foreign matter based on a first light amount received by the light receiver in a case where the light is projected in the first area on the surface of the substrate and a second light amount received by the light receiver in a case where the light is projected in the second area on the surface of the substrate.

11 Claims, 9 Drawing Sheets

(58) Field of Classification Search
CPC .............. G01N 21/8806; G01N 21/94; G01N 2021/8809; H01L 21/0271; H01L 22/10; H01L 22/00; G03F 7/0002
See application file for complete search history.

(56) References Cited

U.S. PATENT DOCUMENTS

| | | | | |
|---|---|---|---|---|
| 2005/0094136 A1* | 5/2005 | Xu | ............... | G01N 21/47 |
| | | | | 356/237.3 |
| 2005/0105791 A1* | 5/2005 | Lee | ............... | G01N 21/47 |
| | | | | 382/145 |
| 2013/0193603 A1* | 8/2013 | Yamada | ............ | G01B 11/303 |
| | | | | 356/600 |
| 2018/0149603 A1* | 5/2018 | Bhattacharyya | ..... | G01R 31/311 |

FOREIGN PATENT DOCUMENTS

| JP | H06186168 A | 7/1994 |
|---|---|---|
| JP | H06347414 A | 12/1994 |
| JP | 3218727 B2 | 10/2001 |
| JP | 2001525919 A | 12/2001 |
| JP | 2013178231 A | 9/2013 |
| JP | 2019164070 A | 9/2019 |

* cited by examiner

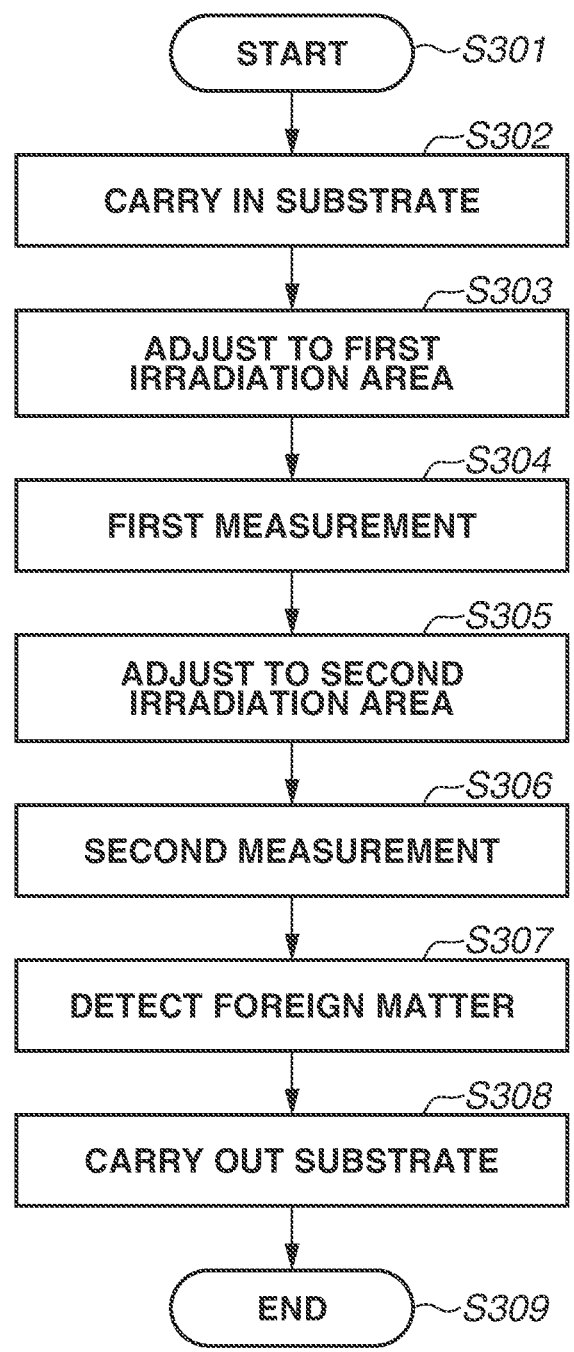

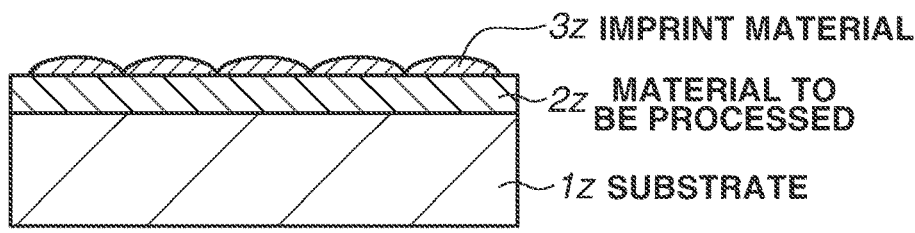
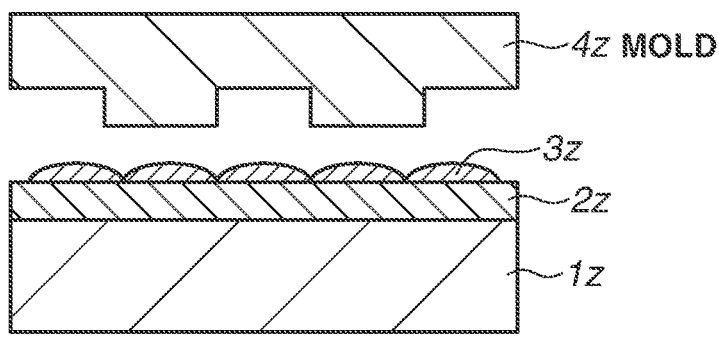
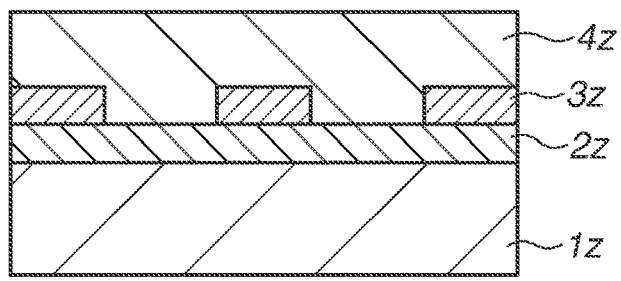
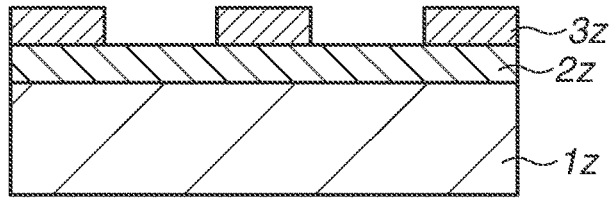
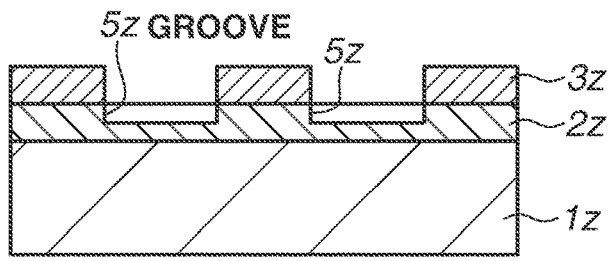
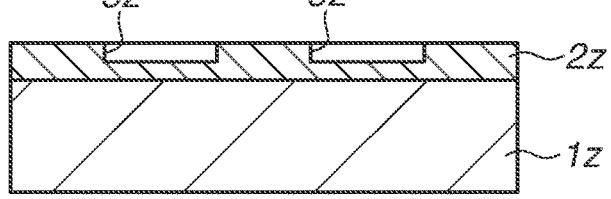

FOREIGN MATTER INSPECTION APPARATUS, FOREIGN MATTER INSPECTION METHOD, PROCESSING APPARATUS, AND ARTICLE MANUFACTURING METHOD

CROSS-REFERENCE TO RELATED APPLICATIONS

This application is a Continuation of International Patent Application No. PCT/JP2020/043560, filed Nov. 24, 2020, which claims the benefit of Japanese Patent Application No. 2019-220760, filed Dec. 5, 2019, both of which are hereby incorporated by reference herein in their entirety.

BACKGROUND OF THE INVENTION

Field of the Invention

The present invention relates to a foreign matter inspection apparatus, a foreign matter inspection method, a processing apparatus, and an article manufacturing method.

Background Art

An article having a microstructure such as a semiconductor device and micro electro mechanical systems (MEMS) can be manufactured using a molding apparatus such as a projection exposure apparatus and an imprint apparatus. In such a molding apparatus, presence of a foreign matter on a substrate can result in a defect in an article to be manufactured. Further, in an imprint apparatus, an imprint material is molded by bringing the imprint material on a substrate into contact with a mold, so that the presence of a foreign matter on the substrate may damage the mold or shorten the life of the mold.

Thus, a foreign matter inspection apparatus can be used to inspect a foreign matter on a substrate. The foreign matter inspection apparatus irradiates a substrate with light and detects a foreign matter by receiving scattered light from the foreign matter by a light receiver. A light receiver having very high sensitivity, for example, a photomultiplier tube can be used to enable detection of, for example, a fine foreign matter of several tens of nm. In a photomultiplier tube, an electron generated at a photocathode by incident light is accelerated by a high voltage and then collides with a plurality of stages of dynodes that generate a secondary electron. A current accumulated before passing through the dynode of a final stage is collected in an anode as an amplified signal.

As described above, the foreign matter inspection apparatus that inspects a foreign matter on a substrate generally employs a method for detecting presence or absence of the foreign matter by irradiating the substrate with obliquely incident laser light and receiving scattered light of the irradiated light from the foreign matter by a light receiver. A method for detecting scattered light is required to distinguish between scattered light due to a structure such as a mark and a pattern on the substrate and scattered light due to the foreign matter, and to detect only the scattered light due to the foreign matter. This is because a structure such as a mark and a pattern is erroneously detected as a foreign matter.

Thus, according to a patent literature 1, a foreign matter inspection method is discussed in which a mechanism that separates scattered light generated on a substrate into parallel (P) polarized light and senkrecht (S) polarized light using a polarizing element and receives respective polarization components by different detectors is provided, and a foreign matter and a pattern are distinguished from one another by comparing intensity of the respective polarization components. According to a patent literature 2, a foreign matter inspection apparatus is discussed that detects scattered light from a foreign matter by distinguishing it from scattered light from a substrate structure based on a fact that scattered light is regularly distributed on a pupil plane of a detection optical system since the substrate structure is periodic.

However, in the foreign matter inspection method according to the patent literature 1, it is necessary to configure a polarizing element that separates scattered light into P-polarized light and S-polarized light and a plurality of detectors, and there is a possibility that a cost and an arrangement space are increased. Further, it is necessary to configure a complicated control system to perform synchronous operation processing of the plurality of detectors in order to compare the intensity of the P-polarized light and the S-polarized light. Further, since some structures on the substrate are aperiodic, there is a possibility that the foreign matter inspection apparatus according to the patent literature 2 cannot distinguish between the scattered light from these structures and the scattered light from the foreign matter.

CITATION LIST

Patent Literature

PTL 1: Japanese Patent Laid-Open No. 62-261044
PTL 2: Japanese Patent No. 3218727

SUMMARY OF THE INVENTION

Therefore, the present invention is directed to the provision of a foreign matter inspection apparatus that detects a foreign matter by distinguishing between scattered light from a structure such as a mark and a pattern on a substrate and scattered light from the foreign matter without configuring a complicated detector or control system.

A foreign matter inspection apparatus according to the present invention is a foreign matter inspection apparatus for detecting a foreign matter on a substrate on which a pattern is formed, including a detection unit including a light projector for projecting light on a surface of the substrate and a light receiver for receiving scattered light from the surface, a change mechanism for changing an area of the light projected by the light projector on the surface of the substrate to a first area and a second area that is smaller than the first area without changing a light amount of the light projected by the light projector, and a control unit for detecting the foreign matter based on a first light amount received by the light receiver in a case where the light is projected in the first area on the surface of the substrate and a second light amount received by the light receiver in a case where the light is projected in the second area on the surface of the substrate.

Further features of the present invention will become apparent from the following description of exemplary embodiments with reference to the attached drawings.

BRIEF DESCRIPTION OF THE DRAWINGS

FIG. 3 is a flowchart illustrating a foreign matter inspection method according to the first exemplary embodiment.

FIG. 9A is a diagram illustrating a manufacturing method of an article.

FIG. 9B is a diagram illustrating the manufacturing method of an article.

FIG. 9C is a diagram illustrating the manufacturing method of an article.

FIG. 9D is a diagram illustrating the manufacturing method of an article.

FIG. 9E is a diagram illustrating the manufacturing method of an article.

FIG. 9F is a diagram illustrating the manufacturing method of an article.

DESCRIPTION OF THE EMBODIMENTS

Figure 1:
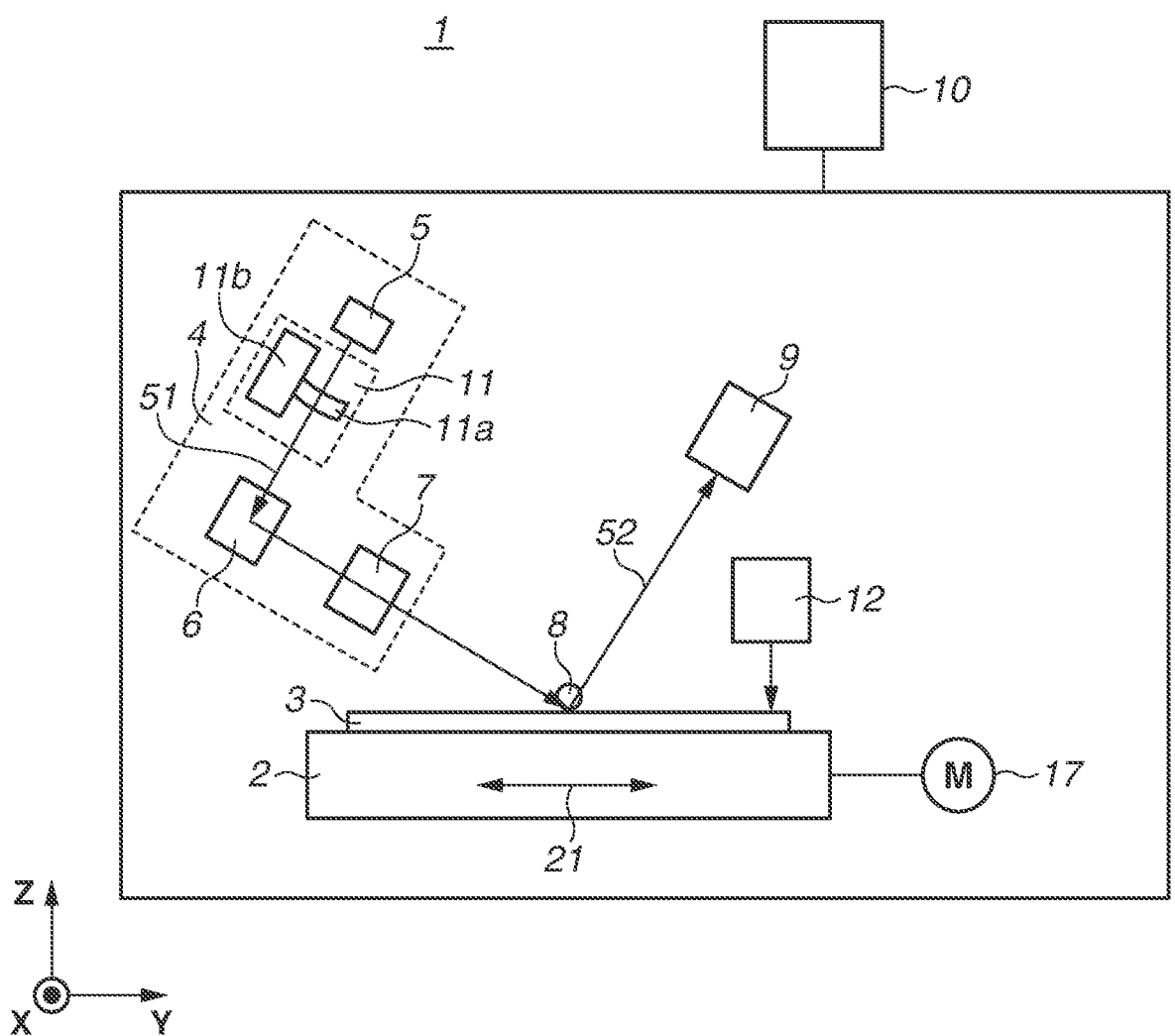
FIG. 1 is a side view illustrating an example of a foreign matter inspection apparatus according to a first exemplary embodiment.

Desirable exemplary embodiments of the present invention will be described in detail below with reference to the attached drawings. The same members are denoted by the same reference numerals throughout the drawings, and duplicate descriptions are omitted.

First Exemplary Embodiment

Figure 2:
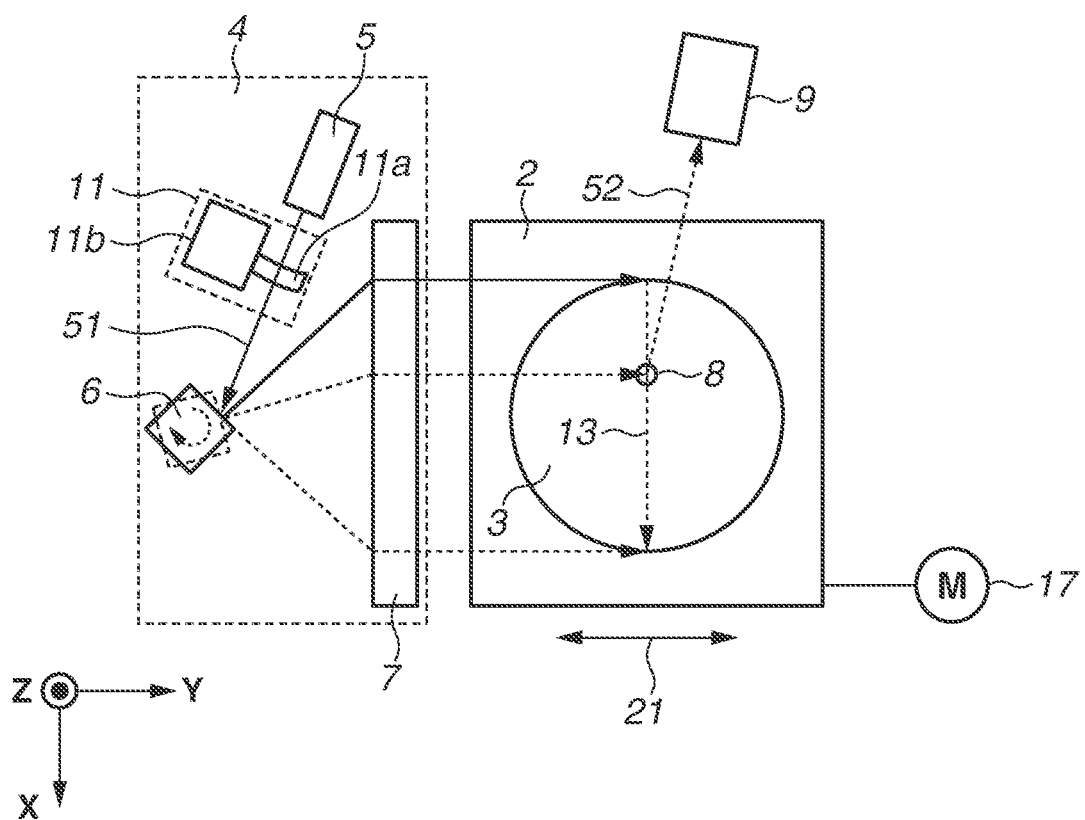
FIG. 2 is a plan view illustrating an example of the foreign matter inspection apparatus according to the first exemplary embodiment.

FIGS. 1 and 2 illustrate an example of a configuration of a foreign matter inspection apparatus 1 according to an exemplary embodiment of the present invention. FIG. 1 is a side view, and FIG. 2 is a plan view. The configuration of the foreign matter inspection apparatus 1 is described below based on an XYZ coordinate system in which a plane parallel to a surface of a substrate 3 is an XY plane. Typically, the XY plane is a horizontal plane, and a Z-axis represents a vertical direction.

The foreign matter inspection apparatus 1 is configured to perform foreign matter detection processing for detecting a foreign matter 8 existing on the surface of the substrate 3. The foreign matter inspection apparatus 1 can include a detection unit 25, a scanning mechanism 22, and a control unit 10. The detection unit 25 can include a light projector 4 that projects light on the surface of the substrate 3, a light receiver 9 that receives scattered light 52 from the surface of the substrate 3, and an adjustment mechanism 11 that adjusts an irradiation area. The scanning mechanism 22 scans a position (an incident position of light on the substrate 3) on the surface of the substrate 3 to which the light is projected by the light projector 4.

The light projector 4 (an irradiation optical system) can include, for example, a light source 5 and a projection optical system 7. The light source 5 generates light (irradiation light 51) to be projected to the surface of the substrate 3. The light source 5 can include, for example, a laser light source. In a case where the foreign matter inspection apparatus 1 is used as an apparatus which inspects the surface of the substrate 3 coated with a photosensitive material, a wavelength that does not sensitize the photosensitive material can be used as a wavelength of the light generated by the light source 5. For example, light used by an imprint apparatus to cure a photosensitive material (an imprint material) can be ultraviolet (UV) light. Thus, in a case where the foreign matter inspection apparatus 1 is incorporated into the imprint apparatus or is used for the imprint apparatus, the wavelength of the light generated by the light source 5 can be 400 nm or more (light having a wavelength different from that of the light that cures the photosensitive material). It is desirable that the light source 5 can change intensity of light to be generated according to a process condition to be applied (for example, reflectivity of the surface of the substrate 3 at the wavelength of the light generated by the light source 5). A semiconductor laser is used as the light source 5, and thus on-off control can be performed at a frequency of, for example, 100 MHz or higher. The projection optical system 7 can include, for example, an fθ lens.

The light projector 4 can include the adjustment mechanism 11 (a spot diameter adjustment mechanism). The adjustment mechanism 11 can include an adjustment lens 11a and an adjustment lens drive mechanism 11b. The adjustment lens 11a is driven by the adjustment lens drive mechanism 11b, and thus an irradiation area (a spot diameter) on the surface of the substrate 3 of the irradiation light 51 passing through the adjustment lens 11a can be changed without changing an amount of light with which the substrate 3 is irradiated. The adjustment mechanism 11 is a change mechanism that can change the irradiation area on the surface of the substrate to a first area (a first spot diameter) and a second area (a second spot diameter) that is smaller than the first area. The adjustment mechanism 11 may employ a method for changing to an arbitrary irradiation area by moving the adjustment lens 11a in an optical axis direction of the irradiation light 51 and a method for changing the irradiation area by moving the adjustment lens 11a to be placed in or to be removed from an optical path of the irradiation light 51.

The adjustment mechanism 11 according to the present exemplary embodiment is described using an exemplary embodiment in which an irradiation area is changed before the irradiation light 51 emitted from the light source 5 is reflected by a polygon mirror unit 6, but may be arranged in another location. It is sufficient that at least the irradiation light 51 from the light source 5 can be changed before the substrate 3 is irradiated therewith.

The light receiver 9 is configured with, for example, a light receiving element that receives the scattered light 52 from the surface of the substrate 3 and from the foreign matter on the substrate 3, and can include a photomultiplier tube. Further, the light receiver 9 may be provided with an optical element for guiding the scattered light 52 to the light receiving element.

The scanning mechanism 22 can include, for example, the polygon mirror unit 6 (a scanning optical system) and a stage drive mechanism 17 (a stage scanning mechanism). The polygon mirror unit 6 includes a polygon mirror and scans the irradiation light 51 by rotating the polygon mirror at a constant speed at an arbitrary speed. The stage drive mechanism 17 drives (scans) a stage 2 (a substrate holding unit) holding the substrate 3 at least in a Y-axis direction. The stage drive mechanism 17 may further drive the stage 2 in another direction, for example, in an X-axis direction and/or with respect to rotation about the Z-axis. In this example, the scanning mechanism 22 performs scanning in the X-axis direction by the polygon mirror unit 6 and scanning in the Y-axis direction by the stage drive mechanism 17. However, for example, scanning in both the X-axis direction and the Y-axis direction may be performed by an optical system including the polygon mirror unit 6 or by the stage drive mechanism 17.

The polygon mirror of the polygon mirror unit 6 is irradiated with the irradiation light 51 emitted from the light source 5 and reflects the irradiation light. The polygon mirror needs to rotate at a speed of, for example, 10000 to 30000 rotations per minute, so that an air bearing having excellent durability can be used for a bearing supporting the polygon mirror. The light reflected by the polygon mirror can be projected onto the substrate 3 via the projection optical system 7. Accordingly, a constant speed rotary motion of the polygon mirror can be converted into a constant speed linear motion of a spot moving on a focal plane of the substrate 3. As the fθ lens in the projection optical system 7, a telecentric type capable of emitting light perpendicular to the focal plane can be used. In FIG. 2, an optical scanning direction 13 indicates a scanning direction converted into the constant speed linear motion and its trajectory. Further, in FIG. 2, a stage scanning direction 21 indicates the scanning direction of the stage 2 and its trajectory. The optical scanning direction 13 is orthogonal to the stage scanning direction 21.

The foreign matter 8 attached to the surface of the substrate 3 can be, for example, a particle with a minimum particle diameter of several tens of nm or more. If the light projector 4 irradiates the foreign matter 8 with light, the scattered light 52 is generated from the foreign matter 8. The light receiver 9 can be arranged to detect a backward reflection from the foreign matter 8 or a sideward reflection from the foreign matter 8. Glass, ceramics, a metal, a semiconductor, a resin, and the like are used for the substrate, and if necessary, a member made of a material different from the substrate may be formed on its surface. Specifically, the substrate includes a silicon wafer, a compound semiconductor wafer, and quartz glass.

The control unit 10 can perform, for example, positioning control of the stage 2 (control of the stage drive mechanism 17), on-off control of the light source 5, control of the polygon mirror unit 6, and control of the adjustment mechanism 11. The control unit 10 can also perform digital signal processing after converting a continuous analog electric signal output from the light receiver 9 into a digital signal. The digital signal processing can include, for example, processing for calculating a position of the center of gravity of a light intensity signal with Gaussian distribution obtained by the scattered light 52 from the foreign matter 8. Further, the digital signal processing can include processing for calculating coordinates of each foreign matter corresponding to center coordinates (0, 0) of the substrate 3 from the position of the center of gravity, the number of scanning times of the light by the polygon mirror unit 6 corresponding to a position of the stage 2, and the number of data sampling from a scanning start position of the light. The number of scanning times of the light corresponds to a position in the Y-axis direction, and the number of data sampling from the scanning start position of the light corresponds to a position in the X-axis direction. Further, the digital signal processing can include processing for calculating a particle diameter of the foreign matter 8 from a peak value and a width of intensity distribution obtained. As described above, the control unit 10 can perform surface inspection based on an output from the light receiver 9.

The control unit 10 can be configured with, for example, a programmable logic device (PLD) such as a field programmable gate array (FPGA), an application specific integrated circuit (ASIC), a general-purpose computer in which a program is incorporated, or a combination of all or a part thereof. The control unit 10 may be provided in the foreign matter inspection apparatus 1 or may be installed in a location different from the foreign matter inspection apparatus 1 and remotely controlled.

The foreign matter inspection apparatus 1 can include a measurement unit 12 (an alignment scope) that measures a position of an alignment mark of the substrate 3. Further, the foreign matter inspection apparatus 1 can include a measurement unit that measures a height of the surface of the substrate 3. The measurement unit that measures the height of the surface of the substrate 3 can include a non-contact type sensor, for example, a reflection type laser displacement meter capable of measuring a mirror surface.

An example of operations of the foreign matter inspection apparatus 1 is described below with reference to FIG. 3. FIG. 3 is a flowchart illustrating a foreign matter inspection method by the foreign matter inspection apparatus according to the present exemplary embodiment. The operations of inspection processing by the foreign matter inspection apparatus 1 can be controlled by the control unit 10.

From step S301, the foreign matter inspection apparatus 1 starts sequence control of foreign matter inspection. In the foreign matter inspection apparatus 1, if the foreign matter inspection is started, in step S302, the substrate 3 is carried into the foreign matter inspection apparatus 1 using a not-illustrated substrate conveyance apparatus, and the substrate 3 is mounted on the stage 2. Before being carried into the foreign matter inspection apparatus 1, the substrate 3 may be able to be positioned to a desired rotation angle or a center position with respect to the stage 2 by a not-illustrated position detection apparatus or positioning apparatus. The positioning can be performed by measuring an outer shape of the substrate 3, a not-illustrated notch or orientation flat provided on an outer peripheral portion, or a positioning mark provided on the substrate 3. Then, the substrate 3 mounted on the stage 2 is moved to a position at which the surface of the substrate 3 is irradiated with the irradiation light 51 and is in a measurement standby state. At that time, the polygon mirror unit 6 rotates at a constant speed, but the light source 5 is in a stop or standby state, and it is desirable that the substrate 3 should not be actually irradiated with the irradiation light 51.

Next, in step S303, the irradiation light 51 is adjusted to have a first spot diameter d1 as a first irradiation area using the adjustment mechanism 11. The driving of the polygon mirror and the adjustment of the first spot diameter d1 by the adjustment mechanism 11 in step S303 may be performed in parallel with the carrying-in of the substrate in step S302.

Next, in step S304, first measurement is started using the irradiation light 51 adjusted to the first irradiation area. In the first measurement in step S304, scanning drive of the stage 2 is started at the same time as the light source 5 starts outputting laser light. The stage scanning direction 21 is a direction orthogonal to the optical scanning direction 13. A driving speed of the stage 2 is set to a speed with which the stage 2 travels a distance less than or equal to the spot diameter (a width of the irradiation area) of the irradiation light 51 on the surface of the substrate 3 with respect to a time of one cycle of scanning by the laser light, and accordingly the surface of the substrate 3 can be inspected without a gap. At the time of the first measurement in step S304, light intensity of the scattered light detected by the light receiver 9 is recorded together with an irradiation position of the irradiation light 51 on the substrate 3 that is calculated from the position of the stage 2.

If the first measurement in step S304 is completed, in step S305, the irradiation area of the irradiation light 51 is adjusted to have a second spot diameter d2 that is different from the first spot diameter d1 using the adjustment mechanism 11. According to the present exemplary embodiment described below, a case in which the second spot diameter d2 is smaller than the first spot diameter d1 is described, but the second spot diameter d2 may be larger than the first spot diameter d1.

Then, in step S306, second measurement is started using the irradiation light 51 adjusted to a second irradiation area in the same manner as the first measurement in step S304. In the first measurement in step S304 and the second measurement in step S306, the same area on the surface of the substrate 3 is irradiated. In the second measurement in step S306, the scanning drive of the stage 2 is started at the same time as the light source 5 starts outputting the laser light. At the time of the second measurement in step S306, the light intensity of the scattered light detected by the light receiver 9 is recorded together with the irradiation position of the irradiation light 51 on the substrate 3 that is calculated from the position of the stage 2.

Then, in step S307, the foreign matter detection is performed by comparing the light intensity of the scattered light measured at the time of the first measurement in step S304 with the light intensity of the scattered light measured at the time of the second measurement in step S306. In the comparison of the light intensity of the scattered light, light amounts of the scattered light from the same place on the surface of the substrate 3 are compared among the scattered light measured in steps S304 and S306. In step S307, the control unit 10 of the foreign matter inspection apparatus 1 performs the foreign matter detection by distinguishing whether the scattered light detected by the light receiver 9 is due to the foreign matter 8 or a pattern 14.

A method for distinguishing the foreign matter performed in the foreign matter detection in step S307 is described in detail. In the first measurement in step S304, the irradiation area of the irradiation light 51 emitted on the surface of the substrate 3 has the spot diameter d1, and in the second measurement in step S306, the irradiation area of the irradiation light 51 emitted on the surface of the substrate 3 has the spot diameter d2. At that time, a total light amount of the irradiation light 51 emitted on the surface of the substrate 3 is constant regardless of a size of the spot diameter. Thus, as the spot diameter is larger, the irradiation area becomes larger, and an illuminance per unit area becomes smaller. If a relationship between the spot diameter d1 and the spot diameter d2 is d1>d2 as described in the present exemplary embodiment, (the illuminance per unit area of the spot diameter d1)<(the illuminance per unit area of the spot diameter d2) is satisfied.

Figure 4A:
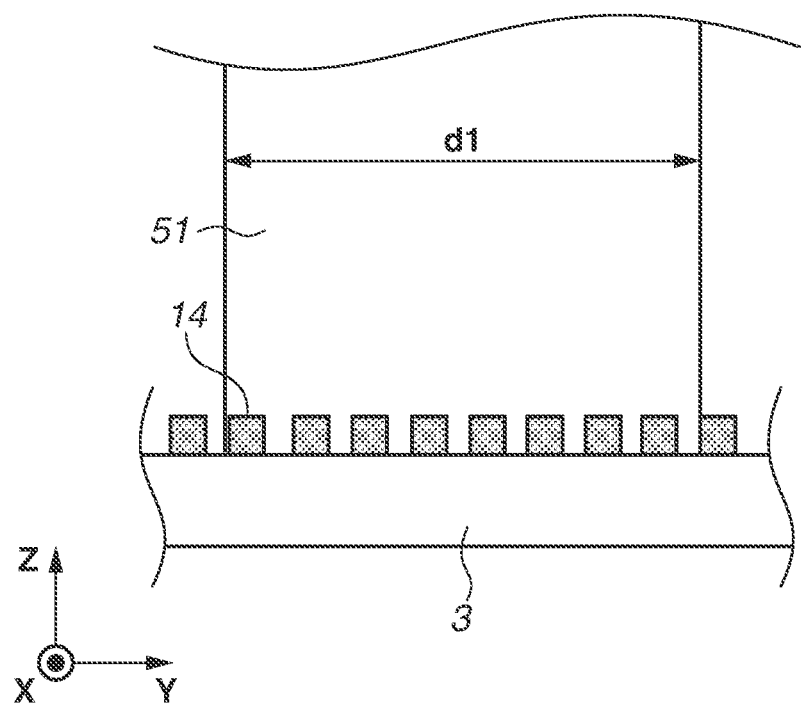
FIG. 4A is a diagram schematically illustrating a state in which a surface of a substrate is irradiated with irradiation light.
Figure 4B:
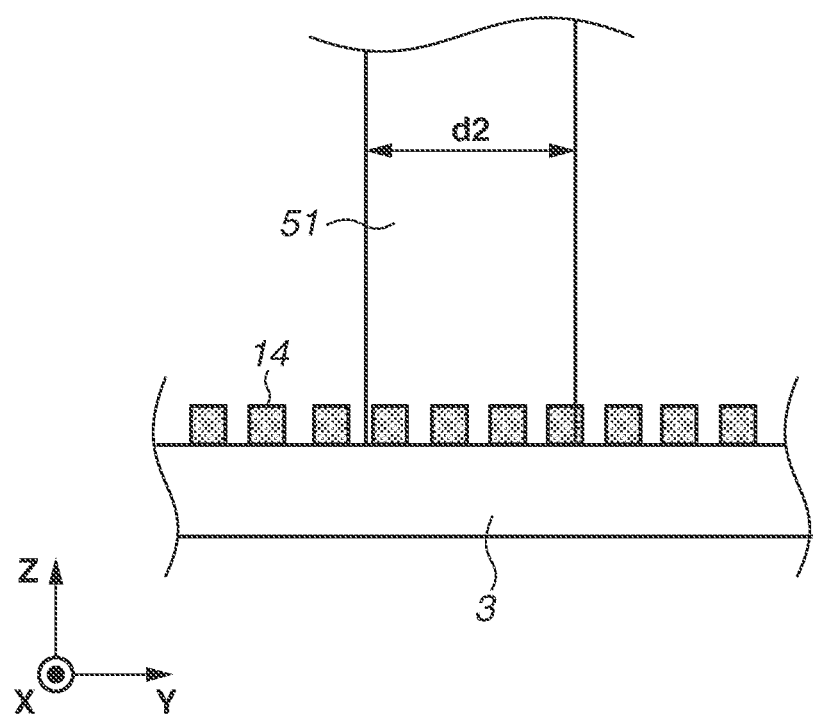
FIG. 4B is a diagram schematically illustrating a state in which a surface of a substrate is irradiated with irradiation light.

A difference in the light intensity of the scattered light due to a difference in the spot diameter in a case where the surface of the substrate 3 is irradiated with the irradiation light 51 in a state without the foreign matter 8 is described with reference to FIG. 4. FIGS. 4A and 4B are diagrams schematically and respectively illustrating a state of the substrate 3 at the time of the first measurement in step S304 and the state of the substrate 3 at the time of the second measurement in step S306 in a state in which there is no foreign matter 8 on the surface of the substrate 3. The pattern 14 and a mark (not illustrated) having a line width of several nm to several hundred nm are formed on the surface of the substrate 3, and the scattered light generated at this time is due to a structure such as the pattern 14. In a case where the spot diameter d1 of the irradiation light 51 emitted on the surface of the substrate 3 is reduced to the spot diameter d2, the irradiation area is narrowed, and also the structure such as the pattern 14 that generates the scattered light is reduced. Meanwhile, the illuminance per unit area is increased, and thus the scattered light per unit area is increased as well. Accordingly, in a case where the scattered light due to the structure such as the pattern 14 is detected in the state in which there is no foreign matter 8 on the surface of the substrate 3, the light intensity of the scattered light to be detected is constant regardless of the size of the spot diameter.

Figure 5A:
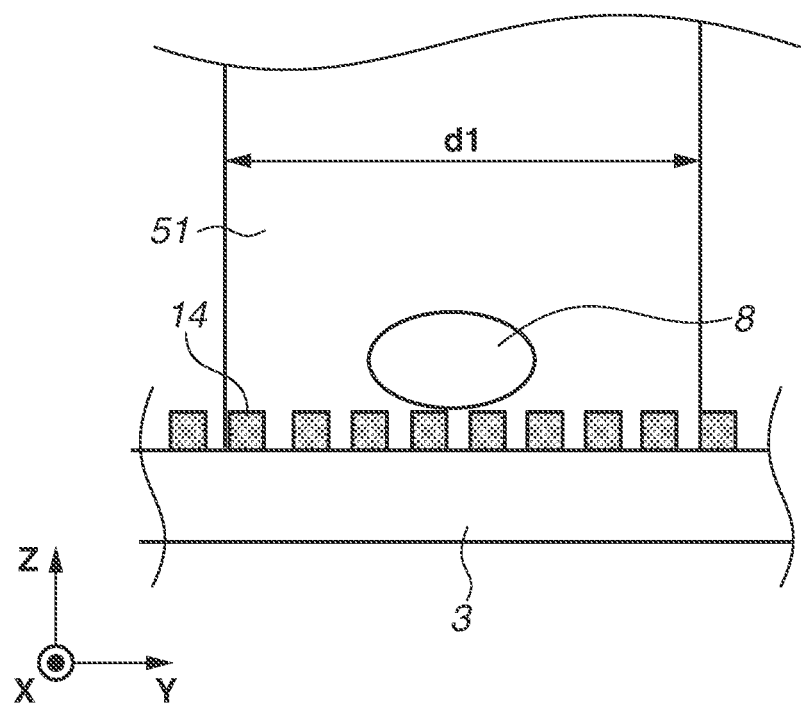
FIG. 5A is a diagram schematically illustrating a state in which a surface of a substrate is irradiated with irradiation light.
Figure 5B:
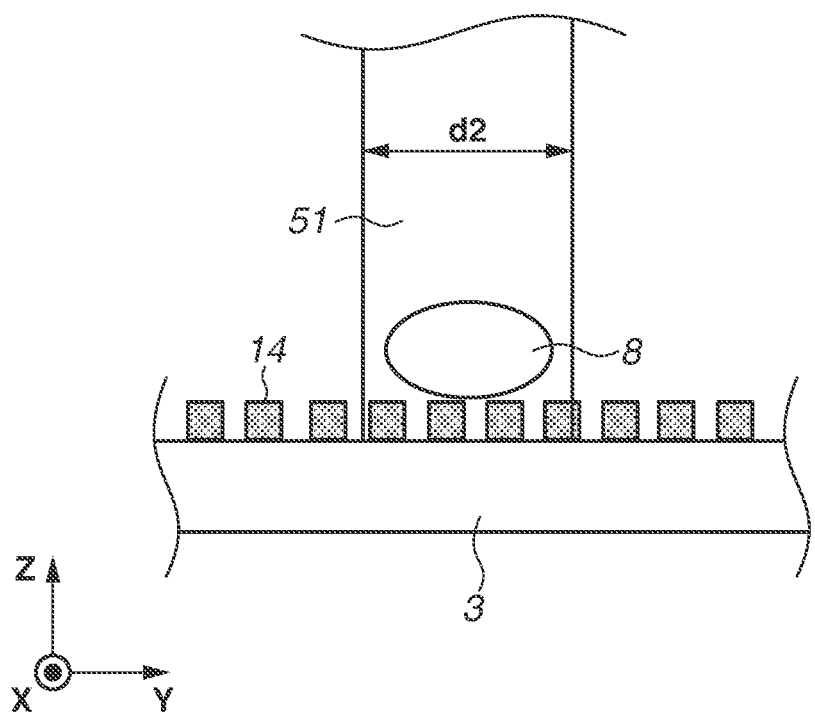
FIG. 5B is a diagram schematically illustrating a state in which a surface of a substrate is irradiated with irradiation light.

Next, the difference in the light intensity of the scattered light due to the difference in the spot diameter in a case where the surface of the substrate 3 is irradiated with the irradiation light 51 in a state where the foreign matter 8 is attached thereto is described with reference to FIG. 5. FIGS. 5A and 5B are diagrams schematically and respectively illustrating the state of the substrate 3 at the time of the first measurement in step S304 and the state of the substrate 3 at the time of the second measurement in step S306 in a state in which the foreign matter 8 is attached to the surface of the substrate 3. A size of the foreign matter 8 attached to the surface of the substrate 3 is several tens of nm to several hundreds of nm in diameter, which is sufficiently small with respect to the spot diameter of several tens of μm to several hundreds of μm. In a case where the spot diameter d1 of the irradiation light 51 emitted on the surface of the substrate 3 is reduced to the spot diameter d2, the illuminance per unit area is increased, and thus intensity of the scattered light generated from the foreign matter is also increased.

As described above, in step S307, it is detected whether the foreign matter is attached to the surface of the substrate 3 based on a measurement result of the first measurement in step S304 and a measurement result of the second measurement in step S306. In the foreign matter inspection method according to the present exemplary embodiment, the foreign matter is distinguished using a fact that there is a difference in a change in the light intensity of the scattered light detected between the pattern 14 and the foreign matter 8 in a case where measurement is performed by changing the spot diameter of the irradiation area of the irradiation light 51 on the surface of the substrate 3. In the foreign matter inspection method according to the present exemplary embodiment, in a case where there is no foreign matter, a light amount of the scattered light does not change between different irradiation areas even if the irradiation area on the surface of the substrate 3 is changed. On the other hand, in a case where there is a foreign matter, the light amount of the scattered light is increased as the irradiation area is smaller if the irradiation area on the surface of the substrate 3 is changed.

In step S308, the substrate 3 subjected to the foreign matter detection is carried out from the foreign matter inspection apparatus 1 by a not-illustrated substrate conveyance apparatus. The comparison of the results of the first measurement and the second measurement in step S307 and data processing may be performed in parallel with the carrying-out of the substrate in step S308.

As described above, the foreign matter attached to the surface of the substrate 3 can be detected using the detection result obtained by detecting the scattered light in a case where the surface of the substrate 3 is irradiated with the irradiation light by changing the size of the irradiation area of the irradiation light 51.

Second Exemplary Embodiment

Figure 6:
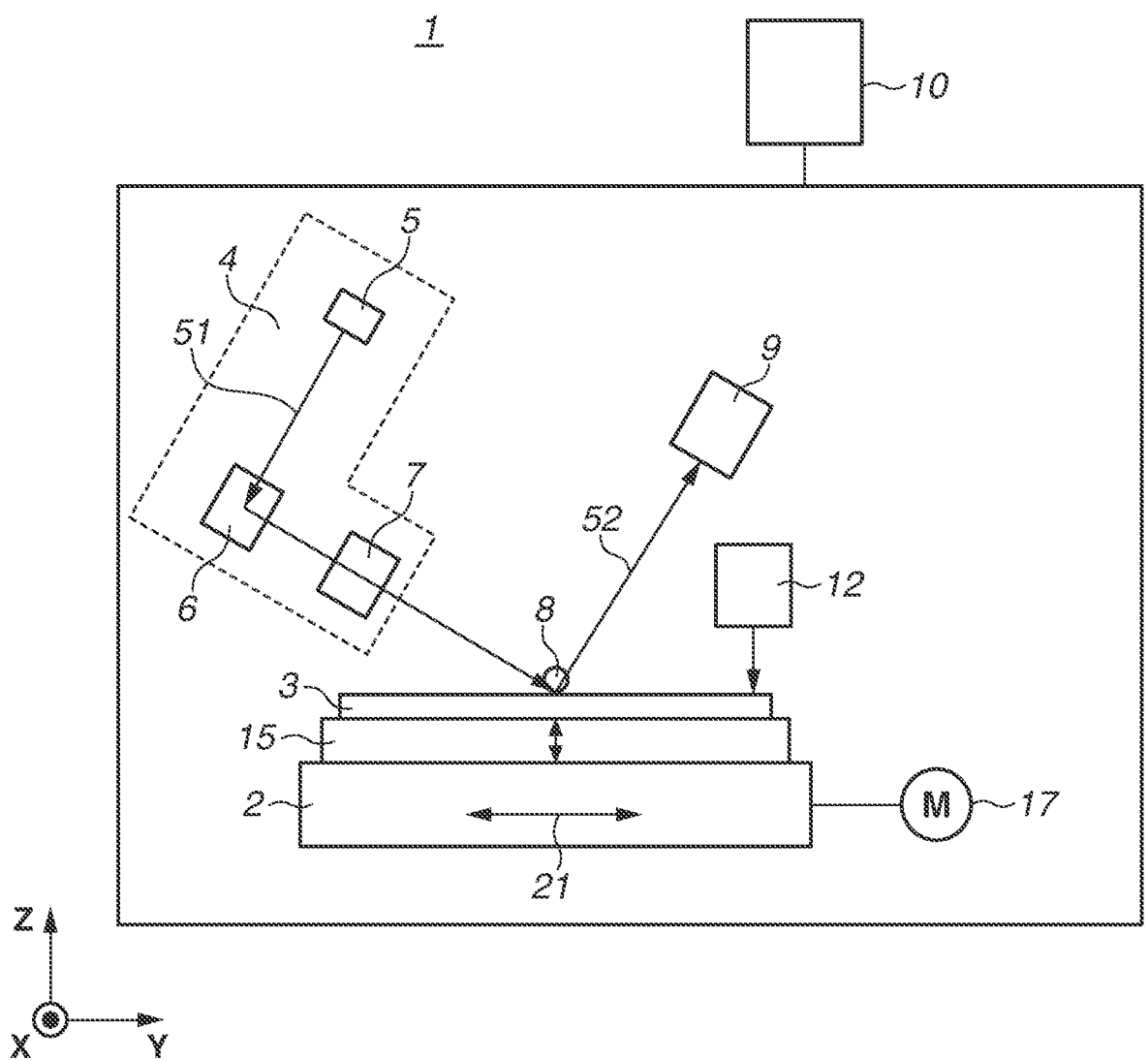
FIG. 6 is a side view illustrating an example of a foreign matter inspection apparatus according to a second exemplary embodiment.

A foreign matter inspection apparatus 1 according to a second exemplary embodiment will be described with reference to FIG. 6. FIG. 6 is a diagram illustrating the foreign matter inspection apparatus 1 according to the second exemplary embodiment. A basic configuration of the foreign matter inspection apparatus 1 that irradiates a surface of a substrate 3 with irradiation light 51, detects scattered light by a light receiver 9, and detects presence or absence of a foreign matter 8 based on a detection result is similar to that of the foreign matter inspection apparatus according to the first exemplary embodiment.

In the foreign matter inspection apparatus 1 according to the first exemplary embodiment, a Z drive mechanism 15 is provided on a stage 2 as a mechanism for changing an irradiation area (a spot diameter) of the irradiation light 51 on the surface of the substrate 3. The Z drive mechanism 15 can drive the stage 2 holding the substrate 3 in a Z direction (a direction perpendicular to the surface of the substrate 3) in FIG. 6 and move the surface of the substrate 3 to a position that is out of a best focusing position of the irradiation light 51. Accordingly, the foreign matter can be detected by changing a size of the irradiation area of the irradiation light 51 on the surface of the substrate 3.

The Z drive mechanism 15 can adjust the spot diameter of the irradiation light 51 formed on the surface of the substrate 3 by moving the substrate 3 up and down. The Z drive mechanism 15 functions as an adjustment mechanism that adjusts the irradiation area of the irradiation light 51 on the surface of the substrate 3. A pattern 14 and the foreign matter 8 can be distinguished from one another by detecting scattered light 52 at different spot diameters of the irradiation light 51 as described in the first exemplary embodiment. If the surface of the substrate 3 is in a position deviated from the best focusing position, the irradiation area of the irradiation light 51 on the surface of the substrate 3 is larger as compared with a case where the surface of the substrate 3 is in the best focusing position.

The irradiation light 51 is obliquely incident on the surface of the substrate 3, so that, in a case where the substrate 3 is moved in the Z direction by the Z drive mechanism 15, an irradiation position of the irradiation light 51 is displaced on the surface of the substrate 3. A displacement amount can be geometrically calculated from an oblique incident angle of the irradiation light 51, a position of the substrate 3 in the Z direction, and a movement amount of the substrate 3 in the Z direction, and in a case where a position at which the scattered light is detected in detection of the foreign matter is recorded, the displacement amount is taken into consideration.

(Molding Apparatus and Foreign Matter Inspection Apparatus)

Figure 7:
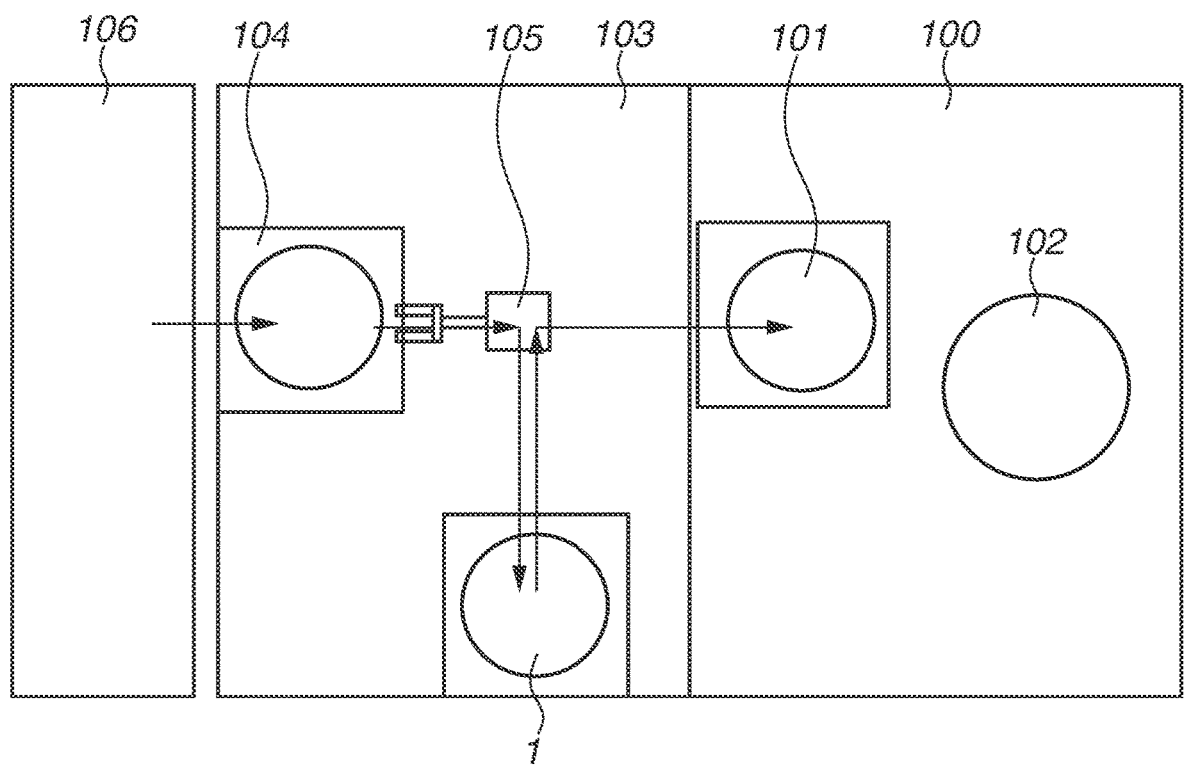
FIG. 7 is a diagram illustrating a processing apparatus according to an exemplary embodiment of the present invention.

FIG. 7 illustrates a configuration of a processing apparatus 1000 according to an exemplary embodiment of the present invention. The processing apparatus 1000 can include the foreign matter inspection apparatus 1 and a molding apparatus 100. The molding apparatus 100 can be configured to perform molding processing for molding a composition on the substrate 3. In an example, the molding apparatus 100 can be configured as an imprint apparatus that molds a composition (an imprint material) on the substrate 3 using a mold having a pattern, in other words, an imprint apparatus that transfers the pattern of the mold to the composition on the substrate 3. The imprint apparatus cures the composition in a state in which the composition on the substrate 3 is in contact with the mold and thus can form the pattern made of the cured composition on the substrate 3. In another example, the molding apparatus 100 can be configured as a flattening apparatus that flattens a composition on the substrate 3 using a mold (a blank template) having a flat portion without a concavo-convex pattern. The flattening apparatus cures the composition in a state in which the composition on the substrate 3 is in contact with the flat portion of the mold and thus can form a membrane made of the cured composition and having a flat upper surface on the substrate 3.

In the processing apparatus 1000, the molding apparatus 100 can include a positioning mechanism 101 that positions the substrate 3 and a molding unit 102 that cures the composition by irradiating the composition with an energy for curing (for example, UV light) in a state in which the composition on the substrate 3 is in contact with the mold.

The molding apparatus 100 can be connected to a conveyance chamber 103. The conveyance chamber 103 can be connected to an auxiliary apparatus 106 such as a coater/developer. The auxiliary apparatus 106 is an apparatus that arranges a composition on the substrate 3. The auxiliary apparatus 106 can supply the substrate 3 on which the composition is arranged to a station 104 in the conveyance chamber 103. A conveyance mechanism 105 can convey the substrate 3 supplied to the station 104 to the stage 2 in the foreign matter inspection apparatus 1. The foreign matter inspection apparatus 1 performs foreign matter detection processing for detecting the foreign matter existing on the surface of the substrate 3. The substrate that is determined to be free of the foreign matter by the foreign matter inspection apparatus 1 can be conveyed to a substrate positioning mechanism 101 in the molding apparatus 100 by the conveyance mechanism 105. On the other hand, the substrate that is determined to include the foreign matter by the foreign matter inspection apparatus 1 can be returned to the auxiliary apparatus 106 or discharged through a not-illustrated discharge port by the conveyance mechanism 105.

FIG. 7 illustrates the processing apparatus 1000 in which one molding apparatus 100 is connected to one foreign matter inspection apparatus 1, but a plurality of molding apparatuses may be connected thereto. It may be a cluster type processing apparatus 1000 in which a plurality of the molding apparatuses 100 is connected to one conveyance chamber 103 (the foreign matter inspection apparatus 1). In this case, a processing result (a detection result) of the foreign matter detection processing in which the foreign matter inspection apparatus 1 detects the foreign matter can be transmitted to the molding apparatuses 100 to which the substrate is conveyed. Each of the molding apparatuses 100 acquires the processing result (the detection result) obtained by the foreign matter inspection apparatus 1 and thus can perform molding processing using information about a position and a size of the foreign matter attached to the substrate.

(Configuration of Station)

Figure 8:
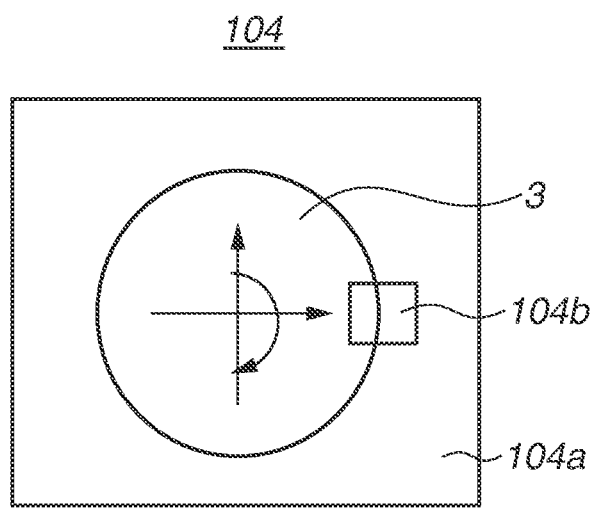
FIG. 8 is a diagram illustrating a configuration example of a station.

FIG. 8 illustrates a configuration example of the station 104. The station 104 can function as a measurement unit having a function of measuring an error regarding a position and a rotation of the substrate 3 based on an outer shape of the substrate 3. The station 104 can include, for example, a drive mechanism 104a that drives the substrate 3 with respect to rotation around the X-axis, the Y-axis, and the Z-axis, and a substrate edge detector 104b. The substrate edge detector 104b is used to detect an edge position of the substrate 3 and can include, for example, a line sensor. An orientation (a notch position) of the substrate 3 and the outer shape of the substrate 3 can be calculated by detecting the edge position of the substrate 3 by the substrate edge detector 104b while rotating the substrate 3 by the drive mechanism 104a. Further, a center position of the substrate 3 is calculated based on the outer shape of the substrate 3, the position (X, Y, Qz) of the substrate 3 is offset so that the conveyance mechanism 105 can always receive the substrate 3 at the same position, and accordingly the conveyance mechanism 105 can convey the substrate 3 with high positional accuracy.

The error regarding the position and the rotation of the substrate 3 measured based on the outer shape of the substrate 3 by the station 104 that functions as the measurement unit may be used to identify an area to be irradiated with light in measurement steps in steps S304 and S306. Accordingly, the position of the substrate 3 can be accurately determined without depending on variations in the outer shape and arrangement of the substrate 3. In this example, measurement of the outer shape of the substrate 3 is performed by the station 104, but a function of rotating the stage 2 and a substrate edge detector that detects an edge of the substrate 3 rotating with the stage 2 may be provided.

(Regarding Manufacturing of Article)

A pattern of a cured material formed using a molding apparatus (an imprint apparatus) is permanently used at least in a part of various articles or is temporarily used in manufacturing of various articles. The article is an electric circuit element, an optical element, micro electro mechanical systems (MEMS), a recording element, a sensor, a mold, or the like. The electric circuit element may include a volatile or a nonvolatile semiconductor memory such as a dynamic random access memory (DRAM), a static RAM (SRAM), a flash memory, and a magnetic RAM (MRAM) and a semiconductor element such as a large scale integration (LSI), a charge coupled device (CCD), an image sensor, and an FPGA. The optical element may include a microlens, a light guide body, a waveguide, an antireflection film, a diffraction grating, a polarizing element, a color filter, a light emitting element, a display, and a solar cell. The MEMS may include a digital mirror device (DMD), a microchannel, and an electromechanical conversion element. The recording element may include an optical disk such as a compact disk (CD) and a digital versatile disk (DVD), a magnetic disk, a magneto-optical disk, and a magnetic head. The sensor may include a magnetic sensor, an optical sensor, and a gyro sensor. The mold may include a mold for imprinting.

A pattern of a cured material is used as it is as a structural member of at least a part of the above-described article or is temporarily used as a resist mask. The resist mask is removed after etching or ion implantation is performed in a processing step of the substrate.

Next, a manufacturing method of an article will be described. As illustrated in FIG. 9A, a substrate 1z such as quartz glass is prepared, and then, an imprint material 3z is applied to a surface of the substrate 1z using an ink jet method and the like. If necessary, a layer of another material such as a metal or a metal compound may be provided on the surface of the substrate 1z. It is assumed that the foreign matter inspection apparatus 1 inspects the substrate 1z for a foreign matter on the substrate in advance, and in a case where the foreign matter is attached, a location thereof is specified. A manufacturing method of an article described here is performed on an area to which the foreign matter is not attached as a result of inspection.

As illustrated in FIG. 9B, a mold 4z for imprinting is placed so that its side on which a concavo-convex pattern is formed faces the imprint material 3z on the substrate. As illustrated in FIG. 9C, the substrate 1z to which the imprint material 3z is applied is brought into contact with the mold 4z, and pressure is applied. The imprint material 3z is filled in a gap between the mold 4z and the substrate 1z. If the imprint material 3 is irradiated with light through the mold 4z in this state, the imprint material 3 is cured.

As illustrated in FIG. 9D, if the mold 4z and the substrate 1z are separated after the imprint material 3z is cured, a pattern of the cured material of the imprint material 3z is formed on the substrate 1z. Thus, an article having the pattern of the cured material as a structural member is obtained. If etching is performed on the substrate 1z using the pattern of the cured material as a mask in the state in FIG. 9D, an article in which a concave portion and a convex portion are reversed with respect to the mold 4z, for example, a mold for imprinting can be obtained.

Next, a manufacturing method for manufacturing an article (a semiconductor integrated circuit (IC) element, a liquid crystal display element, MEMS, and the like) through a step of exposing a substrate inspected by the foreign matter inspection apparatus 1 using an exposure apparatus will be described. An article is manufactured using the above-described exposure apparatus by performing processing including a step of exposing a substrate (a wafer, a glass substrate, and the like) coated with a photosensitive material, a step of developing the substrate (the photosensitive material), and another known step of processing the developed substrate. The another known step includes etching, resist stripping, dicing, bonding, and packaging. According to the present article manufacturing method, it is possible to manufacture an article of higher quality than conventional one.

According to the present invention, a foreign matter inspection apparatus that detects a foreign matter by distinguishing between scattered light from a structure such as a mark and a pattern on a substrate and scattered light from the foreign matter without configuring a complicated detector or control system can be provided.

While the desirable exemplary embodiments of the present invention have been described above, it is to be understood that the present invention is not limited to these exemplary embodiments, and can be modified and changed in various ways within the gist of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An apparatus for detecting a foreign matter on a substrate on which a pattern is formed, the apparatus comprising:
   at least one processor; and
   a memory coupled to the at least one processor, the memory having instructions that, when executed by the processor, causes the at least one processor to function as:

a detection unit including a light projector for projecting light on a surface of the substrate and a light receiver for receiving scattered light from the surface;

a change mechanism for changing an area of the projected light to a first area and a second area that is smaller than the first area without changing a light amount of the projected light and an angle of the projected light; and a control unit for detecting the foreign matter based on a first light amount received by the light receiver in a case where the light is projected in the first area on the surface of the substrate and a second light amount received by the light receiver in a case where the light is projected in the second area on the surface of the substrate, wherein the change mechanism is capable of switching about whether the first light amount is to be detected by the detection unit or the second light amount is to be detected by the detection unit, wherein the control unit detects the foreign matter by comparing the first light amount and the second light amount that are from the same location on the surface of the substrate, and the control unit compares the first light amount and the second light amount and determines that the foreign matter exists on the substrate in a case where the second light amount is greater than the first light amount.

2. The apparatus according to claim 1, wherein the at least one processor further functions as a scanning mechanism for scanning a position on the surface of the substrate where the light is projected by the light projector.

3. The apparatus according to claim 2, wherein the control unit controls light projection by the light projector in response to scanning by the scanning mechanism so that the light is projected on the surface of the substrate.

4. The apparatus according to claim 1,
wherein the light projector includes a light source, and
wherein the change mechanism is placed on an optical path of irradiation light emitted from the light source and includes an adjustment lens for adjusting a size of an irradiation area.

5. The apparatus according to claim 4, wherein the change mechanism includes a drive mechanism for driving the adjustment lens in a direction along an optical axis of the irradiation light.

6. The apparatus according to claim 1, wherein the change mechanism changes the area of the light projected by the light projector on the surface of the substrate by changing a height of the substrate.

7. A processing apparatus for processing a substrate, the processing apparatus comprising:
the apparatus according to claim 1 that is configured to detect a foreign matter on the substrate; and
a molding apparatus for performing molding processing for molding a composition on the substrate using a result of foreign matter detection by the foreign matter inspection apparatus.

8. The processing apparatus according to claim 7, wherein a plurality of the molding apparatuses is provided with respect to the apparatus.

9. The processing apparatus according to claim 7, wherein the molding apparatus molds the composition on the substrate based on a position of the foreign matter on the substrate on which foreign matter detection is performed by the apparatus.

10. An article manufacturing method comprising:
performing foreign matter detection on the substrate by the processing apparatus according to claim 7 and molding the composition on the substrate; and
processing the substrate subjected to the molding.

11. A method for detecting a foreign matter on a substrate on which a pattern is formed, the method comprising:
projecting light in a first area on a surface of the substrate and receiving a first light amount as scattered light from the surface;
projecting light in a second area that is smaller than the first area without changing a light amount and an angle of the light from a case in which the light is projected in the first area on the surface of the substrate and receiving a second light amount as scattered light from the surface;
detecting the foreign matter by comparing based on the first light amount and the second light amount that are from the same location on the surface of the substrate; and
determining the foreign matter exists on the substrate in a case where the second light amount is greater than the first light amount,
wherein an area in which the light is projected is changed from the first area to the second area by a change mechanism, thereby the second light amount is acquired, and
wherein the change mechanism is capable of switching about whether the first light amount is to be detected by the detection unit or the second light amount is to be detected by the detection unit.

* * * * *